United States Patent [19]

Musiol

[11] Patent Number: 5,337,019
[45] Date of Patent: Aug. 9, 1994

[54] INTEGRATED CIRCUIT ARRANGEMENT

[75] Inventor: Lothar Musiol, Munich, Fed. Rep. of Germany

[73] Assignee: Siemens Aktiengesellschaft, Munich, Fed. Rep. of Germany

[21] Appl. No.: 5,738

[22] Filed: Jan. 19, 1993

[30] Foreign Application Priority Data

Feb. 20, 1992 [DE] Fed. Rep. of Germany ....... 4205198

[51] Int. Cl.⁵ ..................... H03F 3/16; H03G 3/30
[52] U.S. Cl. ................................. 330/277; 330/278
[58] Field of Search ................ 330/277, 278, 279

[56] References Cited

U.S. PATENT DOCUMENTS 3,480,873  11/1969  Carter ......................... 330/277
4,806,876   2/1989  Usui et al. .................. 330/279

FOREIGN PATENT DOCUMENTS

0514974A1  11/1992  European Pat. Off. ...... H03G 1/04
3017654C2   6/1990  Fed. Rep. of Germany ......... H01L 23/58

Primary Examiner—James B. Mullins
Attorney, Agent, or Firm—Hill, Steadman & Simpson

[57] ABSTRACT

Signal distortions are avoided without the assistance of external component parts in an integrated circuit arrangement for voltage control of the gain of a field effect transistor having at least first and second gate electrodes. The first gate electrode forms the signal input and the second gate electrode forms the DC voltage control input. An integrated control circuit arrangement is provided which sets the voltage at the first gate electrode of the field effect transistor dependent on a variable voltage at the second gate electrode thereof, whereby the source potential remains unaltered.

14 Claims, 3 Drawing Sheets

INTEGRATED CIRCUIT ARRANGEMENT

BACKGROUND OF THE INVENTION

The invention is directed to an integrated circuit arrangement for voltage control of the gain of a field effect transistor having at least two gate electrodes. The first gate electrode forms the signal input and the second gate electrode forms the DC voltage control input.

Field effect transistors (FETs) having two gate electrodes (FET tetrodes) are utilized in controllable amplifier circuits (cascade circuits). The first gate electrode $G_1$ is employed as signal input and the second gate electrode $G_2$, by contrast, is employed as a DC voltage control input. In a circuit arrangement having fixed source and $G_1$ potentials, only the drain current drops greatly with $G_2$ given gain regulation, and operating points occur which lead to great signal distortions.

As may be seen from FIG. 2, this disadvantage can be avoided in a traditional way in that the source terminal of a field effect transistor $T_1$ comprising two gate electrodes $G_1$ and $G_2$ is only grounded in terms of alternating current ($C_S$), but has its DC voltage potential shifted in current-dependent manner, namely on the basis of a current divider having $R_1$ and $R_2$. Given regulation over the second gate electrode $G_2$, the drain current drops and thus the voltage drop-off via $R_2$, i.e. the source potential, drops. During regulation, the voltage difference between the first gate electrode $G_1$ and the source electrode S is thereby modified such that operating points that lead to non-linear signal distortions are largely avoided. Simultaneously, the lowering of the drain current is thereby opposed. The applied operating voltage is referenced $U_B$ and the control voltage is referenced $U_R$. The signal input is provided with reference numeral 1 and the signal output is provided with reference numeral 2.

SUMMARY OF THE INVENTION

An object of the invention is to create an integrated circuit arrangement of the type initially cited wherein the operating points are set such that signal distortions are avoided, namely without external component parts that serve as auxiliary means, and whereby the manufacturing tolerances of the signal-carrying field effect transistor are largely compensated.

According to the invention, an integrated circuit arrangement is provided for voltage control of the gain of a field effect transistor having at least two gate electrodes. With such a field effect transistor, the first gate electrode forms the signal input and the second gate electrode forms a DC voltage control input. The integrated circuit arrangement sets the voltage at the first gate electrode of the field effect transistor dependent on a variable voltage at the second gate electrode thereof, whereby the source potential remains unaltered.

The advantages achieved with the invention are particularly that the circuit arrangement can be realized in an adequately self-blocking MOS technique since one need not work with negative auxiliary voltages. The first, signal-carrying field effect transistor itself is not contained in any internal control circuit because the second field effect transistor, as a controlling component, contains (i.e., "knows") the electrical properties of the first FET as completely as possible. Compared to the first, signal-carrying FET, the second FET thus forms an identical, although "miniaturized", component. Moreover, the gate electrode and the source electrode of the second (control) FET are respectively connected to the same terminal of the first (signal) FET such that identical potential relationships prevail. So that the similarity of the characteristics of both transistors is not lost, it is expedient that the drain/source voltage of the control transistor does not become significantly lower than that of the signal transistor. Since the drain current dare not drop greatly initially, even given a $G_2$ regulation, this is impressed with a current source. The drop-off of the drain current given great regulation thus necessarily occurs because of the finite operating voltage from which the current source is supplied. In order to close the control loop of the control transistor, a feedback from the drain electrode thereof onto the first gate electrode is provided. The current in the feedback branch is thus low in comparison to the drain current to be impressed.

DESCRIPTION OF THE PREFERRED EMBODIMENTS

Figure 1:
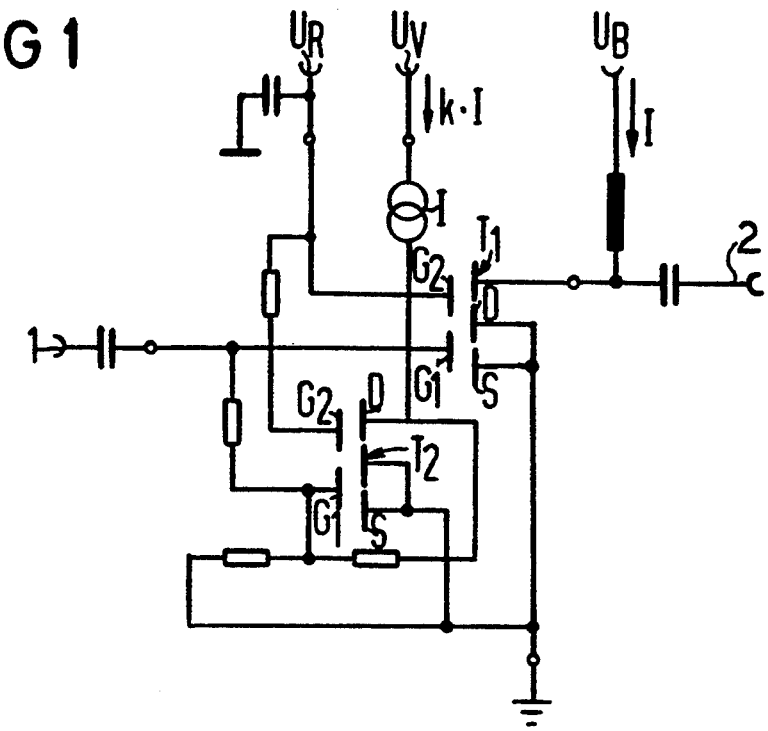
FIG. 1 is a schematic illustration of a circuit arrangement according to the invention.
Figure 2:
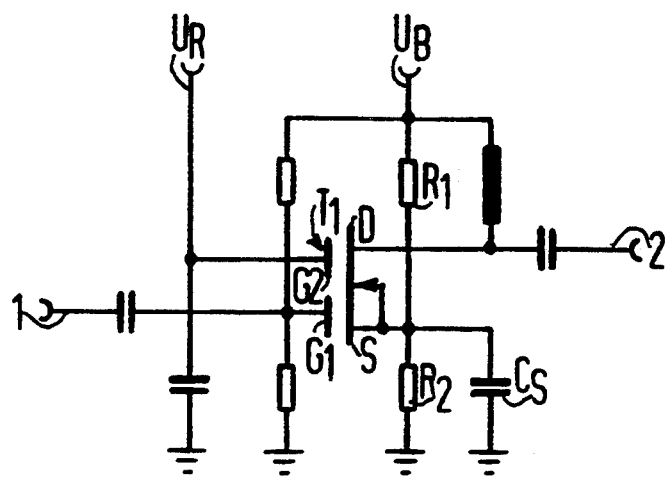
FIG. 2 is a prior art circuit arrangement.

In the circuit arrangement shown in FIG. 1, a second transistor $T_2$ similar to the signal-carrying or operating transistor $T_1$, and likewise having at least two gate electrodes $G_1$ and $G_2$, is inventively added. The source S, gate $G_1$ and gate $G_2$ thereof are respectively coupled in terms of DC voltage to the corresponding elements of the first transistor $T_1$. A nearly constant direct current via the current source I is impressed on this second or control transistor $T_2$ at the drain electrode D. The drain voltage occurring is fed back onto the gate $G_1$—after voltage division or voltage subtraction—in order to set the required gate 1 voltage. A direct connection of drain D and gate 1 of the control transistor $T_2$ is also possible in embodiments having a high, required gate 1 voltage.

Due to the similarity of the two field effect transistors $T_1$ and $T_2$, the control curve impressed on the control transistor $T_2$ is projected onto the operating transistor $T_1$. With decreasing gate 2 voltage (control voltage $U_R$), thus the gate 1 voltage rises at both transistors $T_1$, $T_2$. After the gate 2 voltage has been lowered to a defined extent, the drain current can no longer be impressed on the control transistor $T_2$. However, the gate 1 voltage continues to rise up to an embodiment-dependent final value.

The second or control transistor $T_2$ can be designed smaller than the first or signal or operating transistor $T_1$ by a defined factor $k=W_2/W_1$. $W_1$ denotes the gate width of the signal transistor $T_1$. $W_2$ denotes the gate width of the control transistor $T_2$ given nearly identical gate lengths of the two transistors. Correspondingly, the impressed constant current I must then be selected lower by the factor k than that desired at the signal transistor $T_1$.

The other properties such as, for example, channel length and doping, are to be expediently coincidentally selected at both field effect transistor T and $T_2$ because the second or control transistor $T_2$ is then automatically matched to the first or signal-carrying transistor $T_1$.

Nonetheless, versions are also fundamentally conceivable wherein the control behavior of the control transistor $T_2$ is reproduced in a form deviating from the signal transistor $T_1$. In addition to differences in channel length and doping, this can thereby be a matter of a voltage divider between the control and the signal transistor.

For example, the current I impressed on the second or control transistor $T_2$ can derive from an additional, self-conducting FET triode in drain circuitry, or can be taken via a resistor from a voltage source whose voltage is adequately higher than the required drain-source voltage of the control transistor $T_2$. Due to the size and constancy or reproducibility of this current source I, the behavior of the entire circuit arrangement is co-defined. The design of the feedback between drain and gate $G_1$ of the control transistor $T_2$ also plays a part therein.

For example, the circuit arrangement can be very simply realized with self-blocking dual gate FETs.

The circuit arrangement, however, is also functional with self-conducting FETs, for example by supplying a current via a resistor from a negative auxiliary voltage source into the gate 1 divider.

A circuit arrangement of the invention can thus be applied to field effect transistors having at least two gate electrodes in MIS (for example, Si-MOS) or MES (for example, GaAs barrier layer) technology.

A preferred application of the circuit arrangement is the monolithic integration of control ($T_2$) transistor and signal ($T_1$) transistor in the same manufacturing process. A constant current source can also be co-integrated.

The coupling of the gate electrodes of the second or control transistor $T_2$ to those of the signal-carrying, first transistor $T_1$ can occur in high-impedance fashion, particularly so as not to attenuate the input signal supplied to gate 1 of the operating transistor $T_1$. The supply of the current source from the control voltage or the drain voltage of the signal transistor $T_1$ is also potentially conceivable as versions of the circuit arrangement given integration (eliminating a terminal leg).

Furthermore, given integration of a plurality of signal transistors $T_1$ on the same chip, such transistors can preferably be operated in common with a single control transistor $T_2$.

In FIGS. 1 through 6, the signal input is referenced 1 and the signal output is referenced 2. $U_R$ respectively denotes the control voltage, $U_V$ denotes the supply voltage, and $U_B$ denotes the operating voltage.

Figure 3:
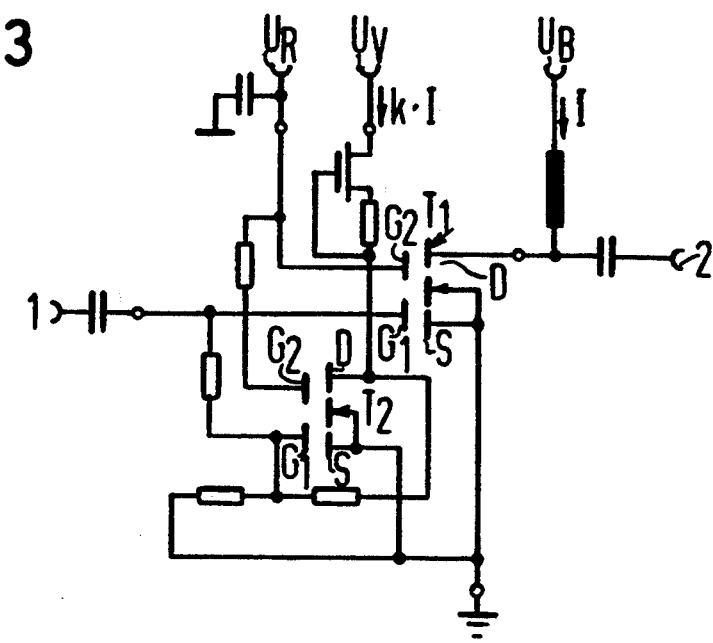
FIGS. 3 through 6 are exemplary embodiments of the circuit arrangement of the invention.

As an exemplary embodiment, FIG. 3 shows the realization of the circuit arrangement of the invention in MOS technology and with an ohmic voltage divider between drain electrode D and first gate electrode $G_1$ of the second field effect or control transistor $T_2$.

Figure 4:
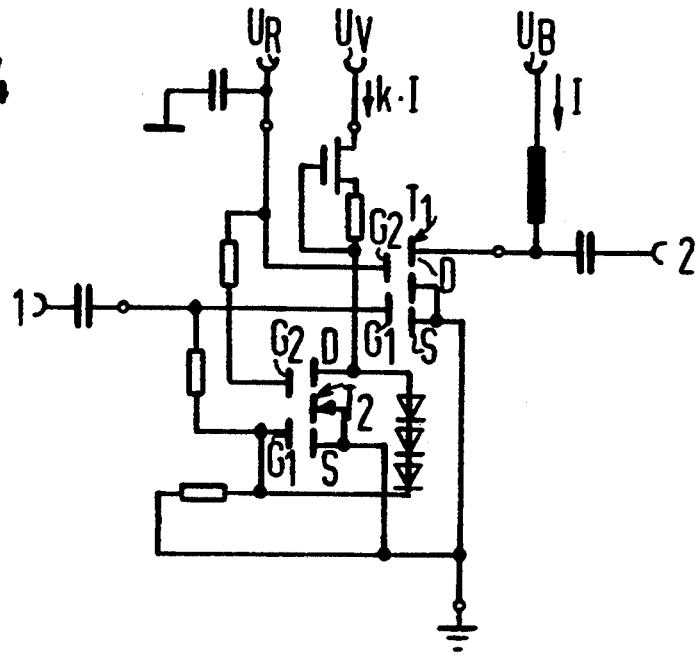

FIG. 4 shows a further possible realization of the circuit arrangement in MOS technology, namely with voltage subtraction (diode flow voltages) between first gate electrode $G_1$ and drain electrode D of the control transistor or second field effect transistor $T_2$.

Figure 5:
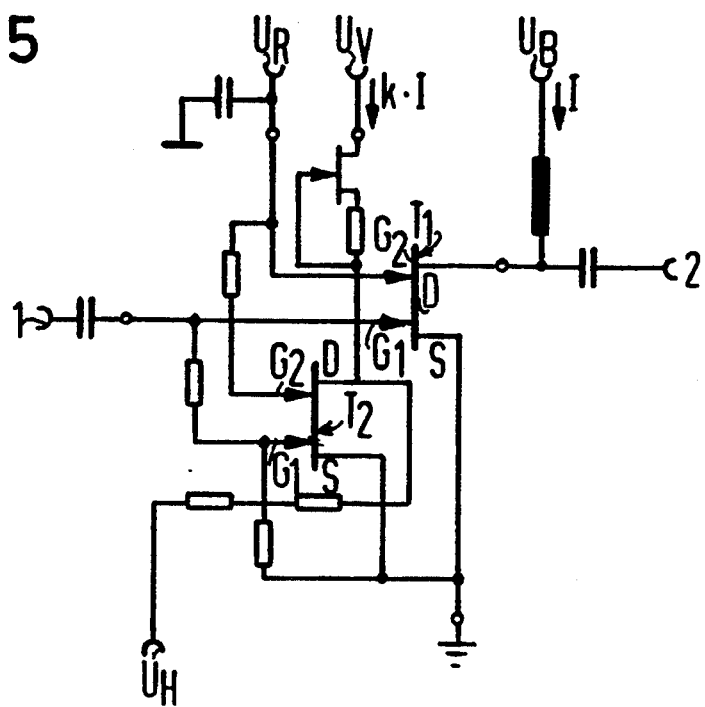

FIG. 5 shows an exemplary embodiment of the circuit arrangement of the invention in MES technology and with negative auxiliary voltage $U_H$ given a self-conductive property of the two transistors $T_1$ and $T_2$.

Figure 6:
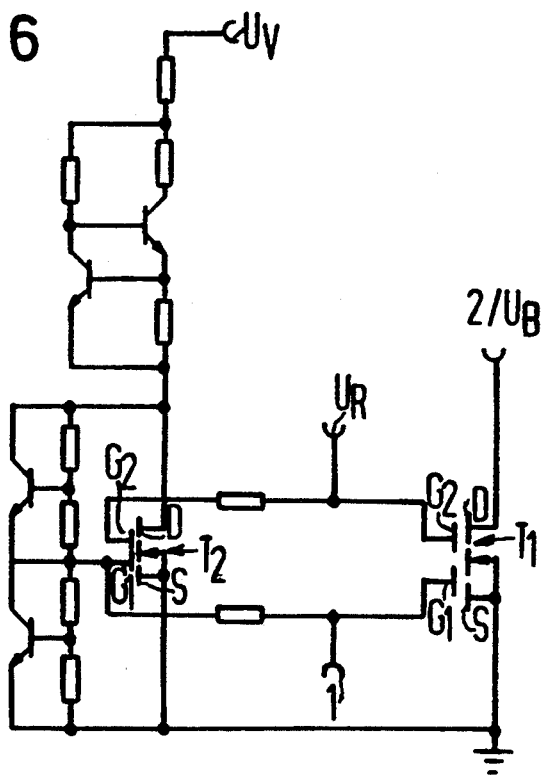

In the circuit arrangement without external wiring shown in FIG. 6, the current source is realized with a bipolar transistor. The feedback, moreover, occurs here by use of non-linear resistors, namely with further bipolar transistors.

Although various minor changes and modifications might be proposed by those skilled in the art, it will be understood that I wish to include within the claims of the patent warranted hereon all such changes and modifications as reasonably come within my contribution to the art.

I claim as my invention:

1. A circuit arrangement, comprising:

a field effect transistor amplifier, said amplifier having a first field effect transistor having at least first and second gate electrodes, the first gate electrode forming a signal input and the second gate electrode forming a DC voltage control input;

control circuit means for setting a voltage at said first gate electrode of the first field effect transistor dependent on a variable voltage present at said second gate electrode of the first field effect transistor, a source potential of the field effect transistor remaining unaltered;

said control circuit means comprising a second field effect transistor that has at least first and second gate electrodes as well as substantially same electrical behavior as said first field effect transistor except for a reduction factor in power consumption, said second transistor being connected to the first transistor such that a control characteristic of the second field effect transistor is transferred onto the first field effect transistor; and means for applying a voltage which tracks and is proportional to but lower than a drain voltage of the second transistor onto the second transistor first gate electrode.

2. A circuit arrangement according to claim 1 wherein a source terminal of the first field effect transistor is at ground potential.

3. A circuit arrangement according to claim 1 wherein a substantially constant direct current is impressed on a drain electrode of said second field effect transistor.

4. A circuit arrangement according to claim 1 wherein a source electrode, said first gate electrode, and said second gate electrode of said second field effect transistor are respectively DC voltage coupled to a source electrode, said first gate electrode, and said second gate electrode of said first field effect transistor; means for impressing a nearly constant direct current on said second field effect transistor at a drain electrode thereof; and said means for applying comprises means for feeding back a drain voltage onto the first gate electrode of said second transistor for setting a required voltage at said first gate electrode of said second transistor.

5. A circuit arrangement according to claim 4 wherein the drain voltage is fed back onto the first gate electrode by a resistor for setting the required voltage at the first gate electrode by a voltage division.

6. A circuit arrangement according to claim 4 wherein said feedback means comprises a direct connection with linear resistors.

7. A circuit arrangement according to claim 4 wherein said feedback means comprises a direct connection by non-linear resistors.

8. A circuit arrangement according to claim 4 wherein said feedback means occurs by voltage division with linear resistors.

9. A circuit arrangement according to claim 4 wherein said feedback means comprises a voltage division with non-linear resistors.

10. A circuit arrangement according to claim 1 wherein the first and second field effect transistors have substantially a same gate length, said second field effect transistor being smaller by a defined factor than the first field effect transistor according to a ratio of gate widths of the first and second field effect transistors such that a current impressed at said second field effect transistor is correspondingly smaller than that provided at said first field effect transistor.

11. A circuit arrangement according to claim 1 wherein the first and second field effect transistors are monolithically integrated in a same manufacturing process.

12. A circuit arrangement according to claim 1 wherein said control circuit means comprises an integrated circuit.

13. An amplifier, comprising:
 a signal input and a signal output;
 a first field effect transistor as an operating transistor having its drain connected to said output, its source connected to a reference potential, its first gate electrode connected to said signal input, and its second gate electrode connected to a control voltage;
 a second field effect transistor having its first gate electrode DC coupled to the first gate electrode of the first transistor, its second gate electrode DC coupled to the second gate electrode of the second transistor, its source DC coupled to the source of the first transistor, and its drain connected to a constant current source and also by a voltage divider to its first gate.

14. An amplifier according to claim 13 wherein the DC coupling of the first and second transistor first gates and first and second transistor second gates comprises in each case a resistor.

* * * * *